Figure 1:
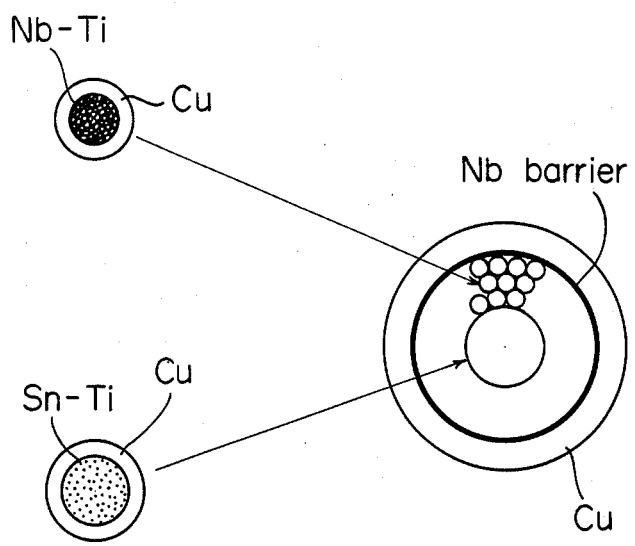

ized Patent

United States Patent [19]
Tachikawa et al.

[11] Patent Number: 4,767,470
[45] Date of Patent: Aug. 30, 1988

[54] PROCESS FOR PRODUCING TI-CONTAINING $NB_3SN$ COMPOSITE SUPERCONDUCTOR

[75] Inventors: Kyoji Tachikawa, Tokyo; Hisashi Sekine, Toride; Shoji Miyashita, Sagamihara, all of Japan

[73] Assignee: National Research Institute for Metals, Tokyo, Japan

[21] Appl. No.: 6,056

[22] Filed: Jan. 23, 1987

[30] Foreign Application Priority Data

Jan. 25, 1986 [JP] Japan .................................. 61-13015

[51] Int. Cl.⁴ ............................................ H01L 39/00
[52] U.S. Cl. .................................. 148/11.5 F; 29/599; 148/133
[58] Field of Search ...................... 148/11.5 F, 11.5 Q, 148/133, 121; 29/529

[56] References Cited

U.S. PATENT DOCUMENTS

| | | | |
|---|---|---|---|
| 4,341,572 | 7/1982 | Tachi | 148/11.5 F |
| 4,385,942 | 5/1983 | Tachi | 148/11.5 F |
| 4,419,145 | 12/1983 | Tachikawa et al. | 148/11.5 F |
| 4,435,228 | 3/1984 | Tachi | 148/11.5 Q |

*Primary Examiner*—Christopher W. Brody
*Attorney, Agent, or Firm*—Pollock, Vande Sande & Priddy

[57] ABSTRACT

A process for producing a Ti-containing $Nb_3Sn$ composite superconductor which comprises working a composite composed of a Cu matrix, a Sn core placed centrally of the matrix and Nb cores disposed around the Sn core and heat-treating the worked composite, said Sn core containing 0 to 30 atomic % of Ti and said Nb cores containing 0.1 to 5 atomic % of Ti on an average.

10 Claims, 1 Drawing Sheet

PROCESS FOR PRODUCING TI-CONTAINING NB₃SN COMPOSITE SUPERCONDUCTOR

This invention relates to a process for producing an improved Nb₃Sn superconductor for generating a strong magnetic field.

For the construction of large-sized strong field magnets required in nuclear reactors, medical machines and instruments, power generators, etc., superconductors having an excellent critical current $I_c$ in a strong magnetic field region are desired.

To increase the generated magnetic field in a magnet, it is essential to increase the upper critical field $H_{c2}$ and the critical current density $J_c$ in a strong magnetic field. $J_c$, as used herein, denotes a quotient of the critical current value $I_c$ actually measured in a magnetic field, divided by the cross-sectional area of the superconductor.

A method has heretofore been known which comprises working a composite composed of a Cu matrix, an Sn core disposed in the center of the matrix and Nb cores disposed around the Sn core, and heat-treating the worked composite to form an Nb₃Sn layer inside the composite. The Nb₃Sn compound superconductor so obtained has the defect that its critical current density $J_c$ in a magnetic field rapidly decreases with increasing magnetic field over 12T.

Japanese Laid-Open Patent Publication No. 86704/1985 filed by Tachikawa et al. discloses that the $J_c$ characteristics of a superconductor in a strong magnetic field are improved by adding Ti only to the Sn core in the above-mentioned prior method. This improvement, however, is not sufficient.

As a result of continued research in an attempt to eliminate the defect of the prior art, the present inventors have found that the insufficient improvement of the $J_c$ characteristics in a strong magnetic field in the method of Japanese Laid-Open Patent Publication No. 86704/1985 is due to the fact that the Ti concentration of the Nb₃Sn layer after the reactive heat-treatment decreases with increasing distance the center where the Sn-Ti core has been placed. Specifically, the optimum concentration of Ti in the Nb₃Sn layer for improvement of Jc at strong magnetic fields is about 1.5 atomic % (H. Sekine et al.: IEEE Trans. on Magn. *MAS*-19, 1429, 1953). When, for example, Ti is added in an amount of 10 atomic % to the Sn core alone, the Ti concentration of the Nb₃Sn layer formed by the reactive heat-treatment is 1.8 atomic % at the outermost site of the Nb₃Sn layer nearest to the Sn-Ti core, but 0.5 atomic % at the outermost site of the Nb₃Sn layer, showing a considerably large gradient. This has been found to be the reason why the $J_c$ characteristics at strong magnetic fields are not sufficiently improved.

It is an object of this invention to solve this problem, and to provide an Nb₃Sn composite superconductor having an excellent critical current $I_c$ at strong magnetic fields.

The present inventors have made extensive investigations in order to achieve the above object, and have found that by adding Ti to the Nb core disposed around the matrix, preferably increasing the amount of Ti as the distance from the centrally disposed Sn core increases, it is possible to make the Ti concentration of the Nb₃Sn layer uniform after the reaction, and greatly increase the critical current $I_c$ at strong magnetic fields. This discovery has led to the present invention.

According to this invention, there are provided (1) a process for producing a Ti-containing Nb₃Sn composite superconductor which comprises working a composite composed of a Cu matrix, a Sn core placed centrally of the matrix and Nb cores disposed around the Sn core and heat-treating the worked composite, said Sn core containing 0 to 30 atomic % of Ti and said Nb core containing 0.1 to 5 atomic % of Ti on an average; and (2) a process for producing a Ti-containing Nb₃Sn composite superconductor which comprises working a composite composed of a Cu matrix, a Sn core placed centrally of the matrix and Nb cores disposed around the Sn core and heat-treating the worked composite, said Sn core containing 0 to 30 atomic % of Ti and said Nb core containing 0.1 to 5 atomic % of Ti on an average, the amount of Ti in the Nb core being increased with increasing distance from the Sn-Ti alloy core.

In the processes of this invention, the amount of Ti to be added to the Sn core is 0 to 30 atomic %, preferably 2 to 15 atomic %, most preferably 4 to 8 atomic %. If its amount exceeds 30 atomic %, the workability of the Sn core is markedly reduced. Accordingly, it should not exceed 30 atomic %.

The amount of Ti to be added to a plurality (preferably 3 to 10) of Nb cores surrounding the Sn core may vary from layer to layer, but is 0.1 to 5 atomic %, preferably 1 to 4 atomic %, most preferably 1.5 to 3 atomic % on an average, and the amount of Ti in each Nb core is up to 10 atomic %. If the amount of Ti is less than 0.1 atomic % on an average, no effect of improving characteristics of the superconductor in a strong magnetic field can be obtained. If it exceeds 5 atomic %, the resulting composite containing the Cu matrix and the Sn core becomes difficult to work. Hence, it should be within the range of 0.1 to 5 atomic %.

In adding Ti to the Nb core, it is preferred to increase the amount of Ti as the distance from the Sn-Ti alloy core increases. By so doing, the Ti concentration of the Nb₃Sn layer after the heat-treatment can be made more uniform, and consequently, the Ic at strong magnetic fields can be increased further.

The following Examples and Comparative Examples illustrate the present invention more specifically.

EXAMPLES 1–5 AND COMPARATIVE EXAMPLES 1–2

As shown in FIG. 1, a composite composed of a Sn-Ti alloy core enclosed with a Cu sheath having a diameter of 3 mm and Nb-Ti alloy cores enclosed with a Cu sheath having a diameter of 0.5 mm around the Sn-Ti alloy core were further enclosed with a Nb barrier and a Cu sheath. The resulting composite was cold-worked without intermediate annealing to produce a multifilamentary superconductor having a final diameter of 0.7 mm. The Nb cores were placed in a three-layer structure, and Ti was added to the Nb core in the concentrations shown in Table 1. After cold-working, the sample was heat-treated at 650° C. for 100 hours in an argon atmosphere. The $I_c$ measured at 16T is shown in Table 1.

TABLE 1

| | Ti concentration (atomic %) | | | | |
|---|---|---|---|---|---|
| | Sn—Ti core | Innermost Nb—Ti core | Middle Nb—Ti core | Outermost Nb—Ti core | $I_c$ at 16 T (A) |
| Comparative Example | | | | | |

TABLE 1-continued

| | Ti concentration (atomic %) | | | | |
| --- | --- | --- | --- | --- | --- |
| | Sn—Ti core | Innermost Nb—Ti core | Middle Nb—Ti core | Outermost Nb—Ti core | $I_c$ at 16 T (A) |
| 1 | 0 | 0 | 0 | 0 | 11 |
| 2 | 8 | 0 | 0 | 0 | 27 |
| Example | | | | | |
| 1 | 4 | 2 | 2 | 2 | 36 |
| 2 | 8 | 1 | 1 | 1 | 38 |
| 3 | 8 | 2 | 2 | 2 | 40 |
| 4 | 8 | 0 | 1 | 2 | 52 |
| 5 | 8 | 1 | 2 | 3 | 61 |

The results in Table 1 show that according to the process of this invention, the $I_c$ of the superconductor in a strong magnetic field of 16T is markedly improved over the prior art.

It is also seen that by varying the amount of Ti added to the Nb-Ti core and increasing the amount of Ti progressively toward the outermost site of the Nb core, the $I_c$ in a strong magnetic field after heat-treatment is further improved over the case of adding Ti in a uniform amount.

What is claimed is:

1. A process for producing a Ti-containing $Nb_3Sn$ composite superconductor which comprises working a composite composed of a Cu matrix, a Sn core placed centrally of the matrix and Nb cores disposed around the Sn core and heat-treating the worked composite, said Sn core containing 2 to 15 atomic % of Ti and said Nb cores containing 0.1 to 5 atomic % of Ti on an average.

2. A process for producing a Ti-containing $Nb_3Sn$ composite superconductor which comprises working a composite composed of a Cu matrix, a Sn core placed centrally of the matrix and Nb cores disposed around the Sn core and heat-treating the worked composite, said Sn core containing 2 to 15 atomic % of Ti and said Nb cores containing 0.1 to 5 atomic % of Ti on an average, the amount of Ti in the Nb core being increased with increasing distance from the Sn-Ti alloy core.

3. The process of claim 1 wherein said Sn core contains 4 to 8 atomic % of Ti.

4. The process of claim 1 wherein said Nb cores contain 1 to 4 atomic % of Ti on an average.

5. The process of claim 1 wherein said Nb cores contain 1.5 to 3 atomic % on the average.

6. The process of claim 1 wherein the amount of Ti in each core is up to 10 atomic %.

7. The process of claim 2 wherein said Sn core contains 4 to 8 atomic % of Ti.

8. The process of claim 2 wherein said Nb cores contain 1 to 4 atomic % of Ti on an average.

9. The process of claim 2 wherein said Nb cores contain 1.5 to 3 atomic % on the average.

10. The process of claim 2 wherein the amount of Ti in each core is up to 10 atomic %.

* * * * *